(12) United States Patent
Sakai et al.

(10) Patent No.: US 6,760,227 B2
(45) Date of Patent: Jul. 6, 2004

(54) MULTILAYER CERAMIC ELECTRONIC COMPONENT AND MANUFACTURING METHOD THEREOF

(75) Inventors: Norio Sakai, Moriyama (JP); Isao Kato, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/372,616

(22) Filed: Feb. 24, 2003

(65) Prior Publication Data

US 2003/0128526 A1 Jul. 10, 2003

Related U.S. Application Data

(63) Continuation-in-part of application No. 10/004,229, filed on Nov. 2, 2001.

(30) Foreign Application Priority Data

Nov. 2, 2000 (JP) ........................................ 2000-335589
Feb. 27, 2002 (JP) ........................................ 2002-051073

(51) Int. Cl.[7] .............................. H05K 1/00; H05K 5/03
(52) U.S. Cl. ........................ 361/736; 361/760; 361/752; 361/728; 174/250; 174/260
(58) Field of Search ................................. 361/728, 736, 361/748, 760, 761, 752, 762; 174/250, 255, 260, 262, 261; 257/700, 678; 310/320

(56) References Cited

U.S. PATENT DOCUMENTS

| | | | |
|---|---|---|---|
| 4,764,233 A | 8/1988 | Ogihara et al. | |
| 4,963,843 A | 10/1990 | Peckham | |
| 5,140,745 A | 8/1992 | McKenzie, Jr. et al. | |
| 5,430,933 A | 7/1995 | Marx et al. | |
| 5,625,935 A * | 5/1997 | Kubota et al. | 29/25.42 |
| 5,635,670 A * | 6/1997 | Kubota et al. | 174/52.1 |
| 5,644,107 A * | 7/1997 | Kubota et al. | 174/262 |
| 5,752,182 A | 5/1998 | Nakatsuka et al. | |
| 5,966,052 A * | 10/1999 | Sakai | 331/68 |
| 6,278,178 B1 | 8/2001 | Kwon et al. | |
| 6,452,781 B1 * | 9/2002 | Ahiko et al. | 361/321.2 |
| 6,538,896 B2 * | 3/2003 | Kameda et al. | 361/752 |
| 6,576,999 B2 * | 6/2003 | Sakai et al. | 257/730 |

FOREIGN PATENT DOCUMENTS

| | | |
|---|---|---|
| JP | 06-096992 | 4/1994 |
| JP | 07-050488 | 2/1995 |
| JP | 07-192960 | 7/1995 |
| JP | 07-192961 | 7/1995 |
| JP | 08-037250 | 2/1996 |
| JP | 08-037251 | 2/1996 |
| JP | 09-186416 | 7/1997 |
| JP | 11-003836 | 1/1999 |
| JP | 11-008157 | 1/1999 |
| JP | 11-330653 | 11/1999 |

* cited by examiner

*Primary Examiner*—David Martin
*Assistant Examiner*—Dameon E. Levi
(74) *Attorney, Agent, or Firm*—Keating & Bennett, LLP

(57) ABSTRACT

A multilayer ceramic electronic component includes a laminated ceramic body provided with terminal electrodes on side surfaces thereof and a cover for covering the laminated ceramic body. Ground terminal electrodes are provided in notches provided in opposed side surfaces opposing of the laminated ceramic body, a plurality of terminal electrodes is arranged in parallel in each of notches provided in the other side surfaces opposing each other. These terminal electrodes are formed by dividing terminal via hole conductors. The cover is disposed so as to cover elements mounted on the laminated ceramic body, and foot portions of the cover are disposed in the notches and are bonded to the ground terminal electrodes.

20 Claims, 14 Drawing Sheets

1a

MULTILAYER CERAMIC ELECTRONIC COMPONENT AND MANUFACTURING METHOD THEREOF

This application is a continuation-in-part of Ser. No. 10/004,229, filed Nov. 2, 2001.

BACKGROUND OF THE INVENTION

1. Field of the Invention

The present invention relates to multilayer ceramic electronic components and manufacturing methods thereof, and more particularly, to an improvement in the formation of terminal electrodes in a multilayer ceramic electronic component having a cover.

2. Description of the Related Art

A multilayer ceramic electronic component and a manufacturing method thereof are disclosed in Japanese Unexamined Patent Application Publication No. 8-37251. This publication describes the following method for manufacturing a multilayer ceramic electronic component.

A plurality of ceramic green sheets is first prepared, throughholes are formed in predetermined ceramic green sheets, and terminal via hole conductors are formed in the throughholes. The terminal via hole conductors may be a conductor filled in the throughhole or a conductor provided on the internal surface of the throughhole. In addition, on predetermined ceramic green sheets, wiring conductors, such as conductive films or via hole conductors other than the terminal via hole conductors described above, are formed.

Next, the ceramic green sheets are laminated to each other and are then pressed, thereby forming a green mother electronic component. This mother electronic component is formed such that when being divided along predetermined dividing lines, electronic component bodies for forming a plurality of multilayer ceramic electronic components are obtained.

Next, at locations where the terminal via hole conductors of the green mother electronic component are to be divided, penetrating holes are formed, and as a result, the terminal via hole conductors are exposed at the internal surfaces of the penetrating holes. In the step described above, one penetrating hole is formed for each terminal via hole conductor.

The green mother electronic component is fired. After firing is performed, a plating film composed of, for example, Ni/Au or Ni/Sn, is formed by wet plating on the terminal via hole conductor exposed at the internal surface of the penetrating hole.

Subsequently, elements are mounted on one major surface of the mother electronic component at which one major surface of each laminated ceramic body is formed.

Next, the mother electronic component is divided along the dividing lines passing through the penetrating holes. Accordingly, by dividing the terminal via hole conductors as described above, a plurality of the electronic component bodies is formed having terminal electrodes formed at main surfaces of notches which are formed by dividing the penetrating holes. The division described above is typically performed in a so-called chocolate-break manner via grooves formed in both major surfaces of the mother electronic component along the dividing lines. The grooves are formed before or after the firing of the mother electronic component.

Next, although not specifically disclosed in the publication described above, a cover is disposed such that an opening thereof faces the laminated ceramic body to cover the elements mounted thereon. In the case described above, since the notches provided with the terminal electrodes at the main surfaces thereof are formed by the division of the penetrating holes, as described above, at least one foot portion, to be disposed in at least one of the notches, is preferably provided on the cover. Hence, when the foot portion is disposed in the notch provided with ground terminal electrodes and is bonded thereto via soldering or other suitable material, the cover is fitted to the laminated ceramic body.

As described above, since the notches are formed in the laminated ceramic body, and the terminal electrodes are formed in these notches, when the cover is fitted to the laminated ceramic body, the following advantages can be obtained.

That is, first, since the foot portion is disposed in the notch, the cover can be easily positioned with respect to the laminated ceramic body.

In addition, since the foot portion and the ground terminal electrode are bonded to each other in the notch, solder used for bonding remains in the notch, and the solder is not likely to cause short-circuiting with another terminal electrode.

The multilayer ceramic electronic component thus formed is mounted on a wiring substrate through the terminal electrodes by soldering. However, when the soldering is performed to bond the foot portion to the ground terminal electrode, the solder provided therebetween may remelt when the soldering is performed for the wiring substrate as described above. In this case, the solder bonding the foot portion to the ground terminal electrode may melt and flow to another terminal electrode. However, since the ground terminal electrodes are formed in the notches, as described above, the solder is prevented from flowing out.

However, the conventional technique described above has the following problems that must be overcome.

First, problems occur when the alignment pitch of the terminal electrodes is decreased, for example, to 0.6 mm or less.

In order to decrease the alignment pitch of the terminal electrodes, in addition to a decrease in the diameter of the penetrating hole provided for dividing the terminal via hole conductor, the width thereof exposed at the internal surface of the penetrating hole must be decreased.

However, when the size of the penetrating hole is decreased, the flow of a wet plating solution used for plating the exposed area of the terminal electrode becomes inferior, and as a result, it is difficult to appropriately form the plating film. In addition, since the exposed width of the terminal via hole conductor is decreased, it is more difficult to form an appropriate plating film.

In addition, in order to decrease the alignment pitch of the terminal electrodes, the pitch of the penetrating holes must also be decreased. However, when the pitch described above is decreased, a portion between the adjacent penetrating holes is subject to breakage in a step of forming the penetrating hole or a firing step.

When the pitch of the penetrating holes is decreased, projections having a sawtooth shape are formed between the adjacent notches provided in the laminated ceramic body obtained by the division described above, and hence when the laminated ceramic body is handled, these sawtooth projections often cause chipping.

In addition, in order to form a greater number of the terminal electrodes, the number of the penetrating holes is increased, and as a result, the number of steps of forming the penetrating hole is also increased.

SUMMARY OF THE INVENTION

To overcome the problems described above, preferred embodiments of the present invention provide a greatly improved multilayer ceramic electronic component including a cover and a manufacturing method thereof.

A multilayer ceramic electronic component according to a preferred embodiment of the present invention includes a laminated ceramic body including a plurality of ceramic layers laminated on each other, in which a first major surface and a second major surface face each other, and first, second, third, and fourth side surfaces, each of which extends between the first and the second major surfaces. In this arrangement, the first and the third side surfaces face each other, and the second and the fourth side surfaces face each other.

First, second, third, and fourth notches are provided in the first, second, third, and fourth side surfaces, respectively, of the laminated ceramic body described above.

Ground terminal electrodes are provided at main surfaces of the first and third notches, and a plurality of terminal electrodes are arranged in parallel at a main surface of each of the second and fourth notches. The plurality of terminal electrodes disposed at the main surface of each of the second and fourth notches may include ground terminal electrodes electrically connected to the ground terminal electrodes provided at the main surfaces of the first and third notches.

At least one element is mounted on the first major surface of the laminated ceramic body.

A cover is arranged such that an opening thereof faces the laminated ceramic body to cover the at least one element described above. The cover includes foot portions disposed in the first and third notches, such that the foot portions are bonded to the respective ground terminal electrodes, thereby fitting the cover to the laminated ceramic body.

In the multilayer ceramic electronic component described above, the cover is preferably made of a metal, and the foot portions and the ground terminal electrodes are preferably bonded to each other via solder or a conductive adhesive.

In addition, the terminal electrodes are preferably defined by dividing terminal via hole conductors.

The first, second, third, and fourth notches are each preferably arranged so as to extend from the first major surface to the second major surface.

Another preferred embodiment of the present invention provides a method for manufacturing the multilayer ceramic electronic component described above, and more particularly, provides a method for manufacturing multilayer ceramic electronic components, each of which includes first, second, third, and fourth notches arranged so as to extend from a first major surface to a second major surface, and terminal electrodes formed by dividing terminal via hole conductors.

The method for manufacturing the multilayer ceramic electronic components according to a preferred embodiment of the present invention includes a step of manufacturing a green mother electronic component is carried out. The green mother electronic component includes a plurality of ceramic green sheets which are laminated to each other and which are provided with the terminal via hole conductors to be formed into the terminal electrodes.

In addition, a second step of forming penetrating holes is performed. The penetrating holes penetrate the green mother electronic component at locations where the terminal via hole conductors are to be divided, thereby exposing the terminal via hole conductors at the internal surfaces of the penetrating holes.

A third step of firing the green mother electronic component is performed.

In addition, a fourth step of dividing the mother electronic component along dividing lines passing through the penetrating holes is performed to obtain a plurality of electronic component bodies. Each of the electronic component bodies is provided with the terminal electrodes formed by the division of the terminal via hole conductors, and the terminal electrodes are provided at main surfaces of notches formed by the division of the penetrating holes.

A fifth step of mounting elements on first major surfaces of the electronic component bodies is performed.

In the first step described above, the terminal via hole conductors are provided for the green mother electronic component such that ground terminal electrodes are formed at main surfaces of the first and third notches provided in a first and third side surface, respectively, of each of the electronic component bodies formed in the fourth step, and a plurality of terminal electrodes arranged in parallel are formed at a main surface of each of the second and fourth notches formed in a second and fourth side surface, respectively.

In addition, in the method for manufacturing the multilayer ceramic electronic components according to a preferred embodiment of the present invention, a sixth step is performed, which includes disposing covers such that openings thereof face the electronic component bodies to cover the respective elements, placing foot portions in the first and second notches, and bonding the foot portions to the ground terminal electrodes such that the covers are fitted to the respective electronic component bodies.

When the first step of manufacturing the green mother electronic component is performed, the first step preferably includes preparing said plurality of ceramic green sheets, providing throughholes in at least one of the plurality of ceramic green sheets for disposing the terminal via hole conductors therein, forming the terminal via hole conductors in the throughholes, forming wiring conductors on at least one of the plurality of ceramic green sheets, and laminating the plurality of ceramic green sheets to each other.

In addition, the fifth step is preferably performed for the electronic component bodies before the fourth step is performed.

Furthermore, the sixth step is preferably performed for the electronic component bodies after the fourth step is performed.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
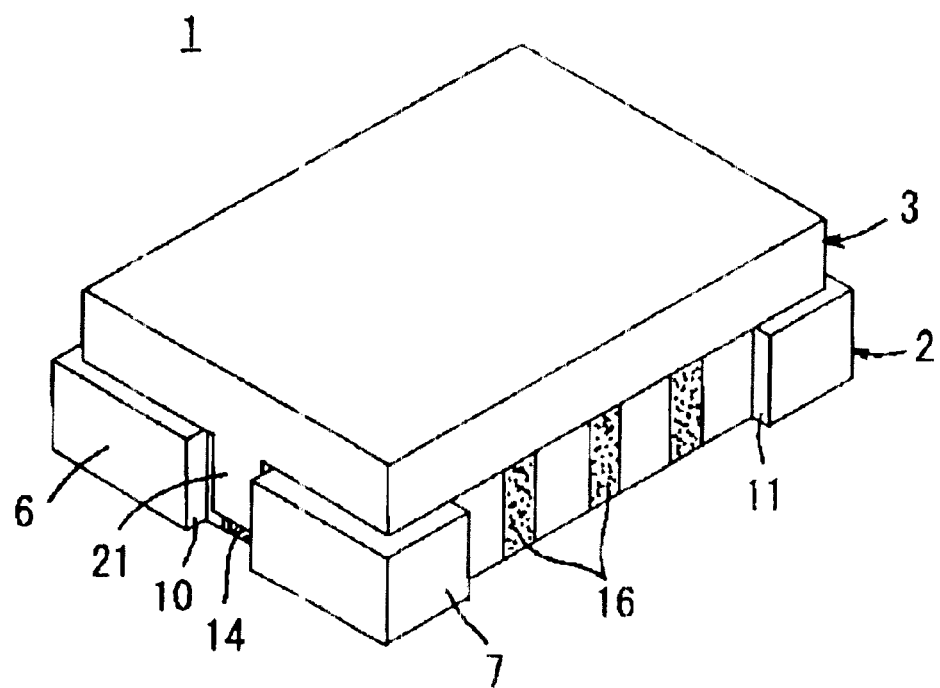
FIG. 1 is a perspective view showing the external appearance of a multilayer ceramic electronic component according to a first preferred embodiment of the present invention.
Figure 7:
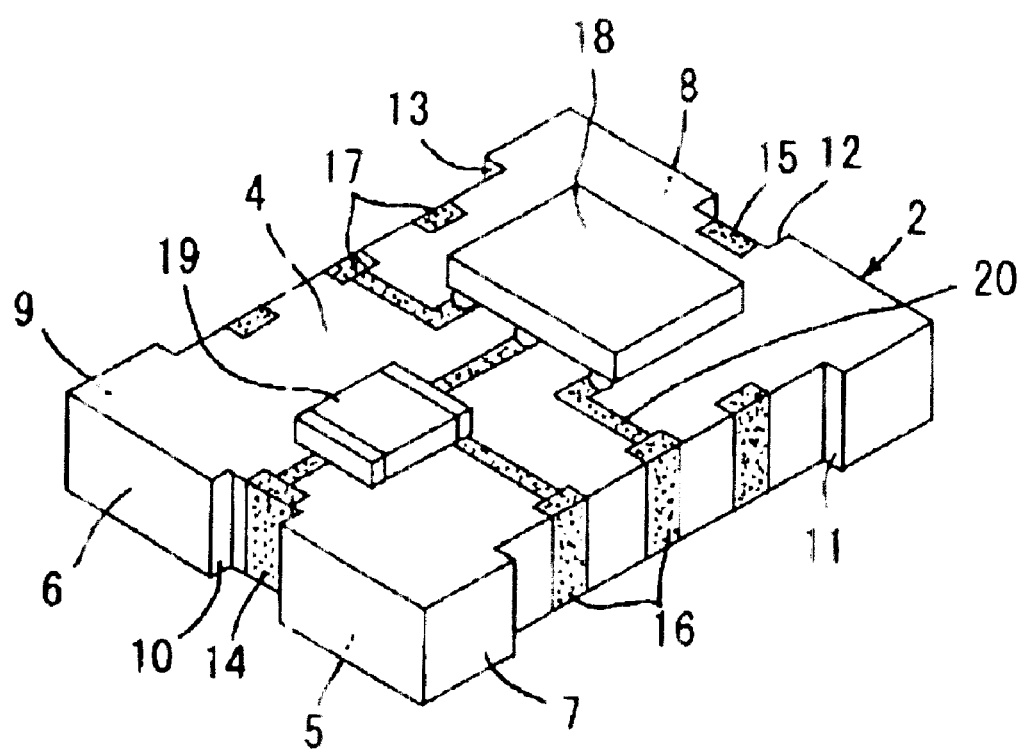
FIG. 7 is a perspective view showing a laminated ceramic body obtained by dividing the mother electronic component shown in FIG. 6.

FIG. 1 is a perspective view showing the external appearance of a multilayer ceramic electronic component 1 according to a first preferred embodiment of the present invention. The multilayer ceramic electronic component 1 includes a laminated ceramic body 2 and a cover 3. In FIG. 7, the laminated ceramic body 2 is shown when the cover 3 is removed, and in FIG. 8, only the cover 3 is shown.

As described below, the laminated ceramic body 2 includes a plurality of ceramic layers laminated to each other.

In addition, as shown in FIG. 7, the laminated ceramic body 2 has first and second major surfaces 4 and 5 facing each other, and first, second, third, and fourth side surfaces 6, 7, 8, and 9 extending between the first and the second major surfaces 4 and 5. The first and third side surfaces 6 and 8 face each other, and the second and fourth side surfaces 7 and 9 face each other.

In the first, second, third, and fourth side surfaces 6, 7, 8, and 9 of the laminated ceramic body 2, first, second, third, and fourth notches 10, 11, 12, and 13 are provided, respectively. Each notch 10, 11, 12 and 13 extends from the first major surface 4 to the second major surface 5.

At the main surfaces of the first and third notches 10 and 12, terminal electrodes 14 and 15 are provided, respectively. These terminal electrodes 14 and 15 are each arranged such that one end portion thereof (bottom side in the figure) extends to the second major surface 5, and the other end portion (top side in the figure) extends to the first major surface 4. In addition, a plurality of terminal electrodes 16 are arranged in parallel at the main surface of the second notch 11, and a plurality of terminal electrodes 17 are arranged in parallel at the main surface of the fourth notch 13. These terminal electrodes 16 and 17 are each arranged such that one end portion thereof (bottom side in the figure) extends to the second major surface 5, and the other end portion (top side in the figure) extends to the first major surface 4.

On the first major surface 4 of the laminated ceramic body 2, elements 18 and 19 are mounted. In order to mount these elements 18 and 19, several conductive films 20, each having an appropriate pattern, are provided as a wiring conductor on the first major surface 4 of the laminated ceramic body 2. In FIG. 7, the conductive films 20 are shown. However, in order to avoid complicating the figure, it is to be understood that these conductive films are schematically shown.

Although not shown in detail, the element 18 is preferably an electronic element, such as a semiconductor IC chip, and is electrically connected to the conductive film 20 through a bump electrode provided on the bottom surface of the element 18. In addition, the element 19 is a surface-mounting passive element, such as a multilayer ceramic capacitor, which is electrically connected to the conductive film 20 via a terminal electrode provided at the end portion thereof.

Figure 8:
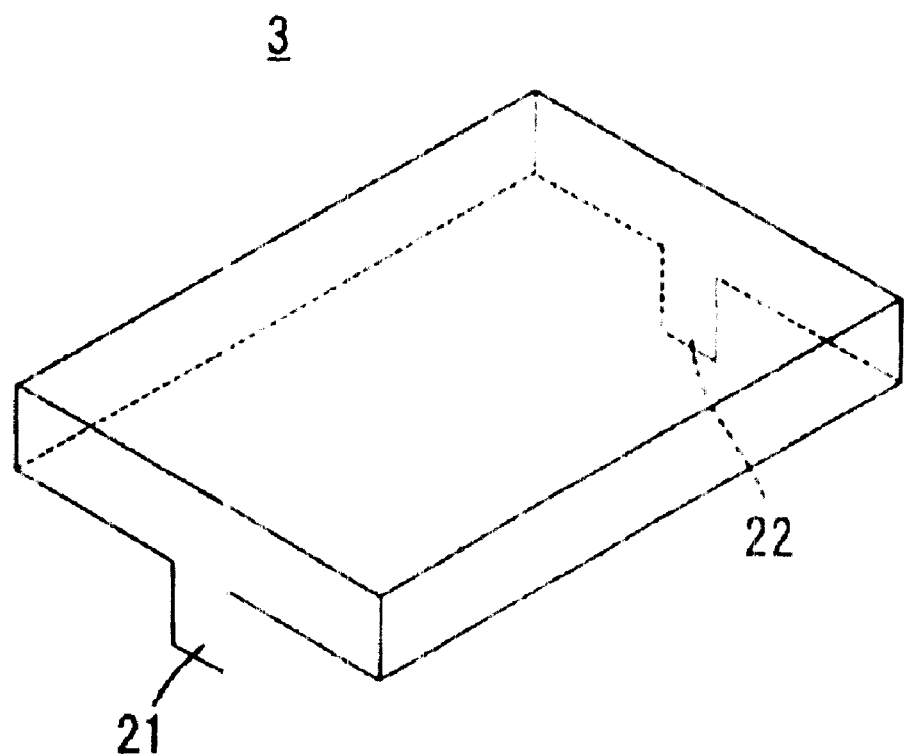
FIG. 8 is a perspective view showing only the cover shown in FIG. 1.

As shown in FIG. 8, the cover 3 includes an opening facing downward. The cover 3 includes foot portions 21 and 22 which are to be disposed in the first and third notches 10 and 12, respectively.

The opening of the cover 3 faces the laminated ceramic body 2 side so as to cover the elements 18 and 19, and the foot portions 21 and 22 are bonded to the terminal electrodes 14 and 15 while being disposed in the respective notches 10 and 12, respectively. Hence, the cover 3 is attached to the laminated ceramic body 2.

Since the foot portions 21 and 22 of the cover 3 are electrically connected to ground conductive films provided inside the laminated ceramic body 2, each of the terminal electrodes 14 and 15 defines a ground terminal electrode.

In addition, the cover 3 is preferably made of metal, and in the case described above, the foot portions 21 and 22 are bonded to the ground terminal electrodes 14 and 15, respectively, via solder or a conductive adhesive. Alternatively, instead of a metal, the cover 3 may be made of, for example, a resin. When the cover 3 is formed of a resin and is preferably maintained at the ground potential, a conductive plating film or other suitable material may be provided on the surface of the resin.

The multilayer ceramic electronic component 1 described above is preferably manufactured by the method described below.

Figure 2:
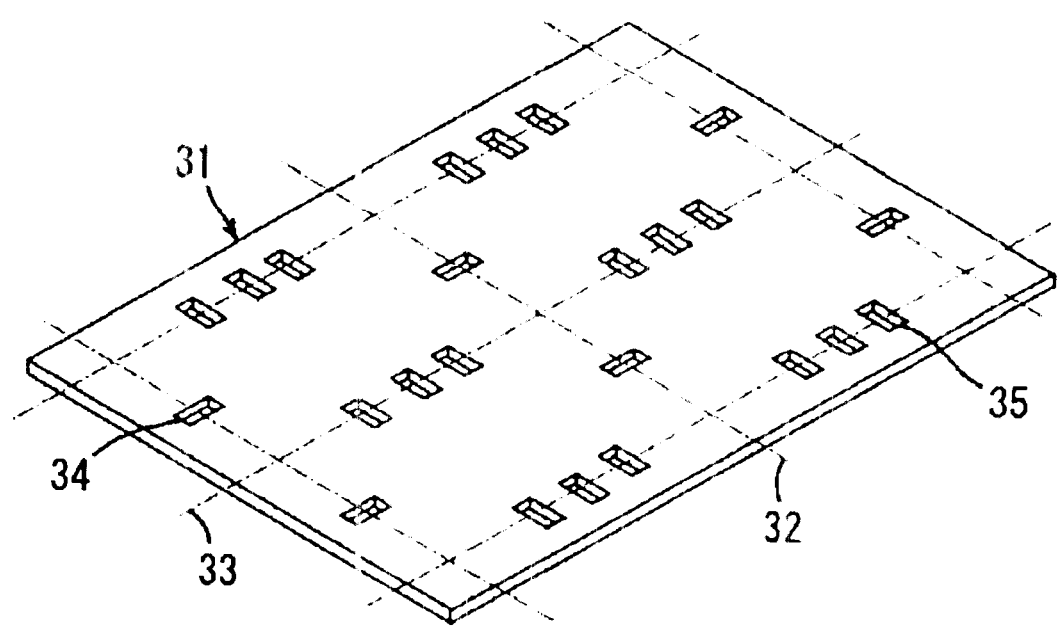
FIG. 2 is a perspective view showing a ceramic green sheet prepared for manufacturing the multilayer ceramic electronic component shown in FIG. 1, the ceramic green sheet being provided with throughholes.

First, as shown in FIG. 2, a ceramic green sheet 31 is prepared. The ceramic green sheet 31 is used to form a mother electronic component, and by dividing the mother ceramic electronic component mentioned above, a plurality of electronic component bodies 2 are obtained. Each of the electronic component bodies 2 is a constituent element for forming the multilayer ceramic electronic component 1. Dividing lines 32 and 33 described above are indicated by the chain lines shown in FIG. 2. The dividing lines 32 and 33 substantially perpendicularly intersect each other, and each region defined by the dividing lines 32 and 33 defines an area in which one laminated ceramic body 2 is formed.

On the dividing line 32 of the ceramic green sheet 31, throughholes 34 are provided in the ceramic green sheet 31, and throughholes 35 are provided on the dividing lines 33. In this preferred embodiment, the three throughholes 35 arranged in parallel are provided on the dividing line 33 in each region described above. The throughholes 34 and 35 shown in the figure have a substantially rectangular plan shape. However, other plan shapes may be used.

Figure 3:
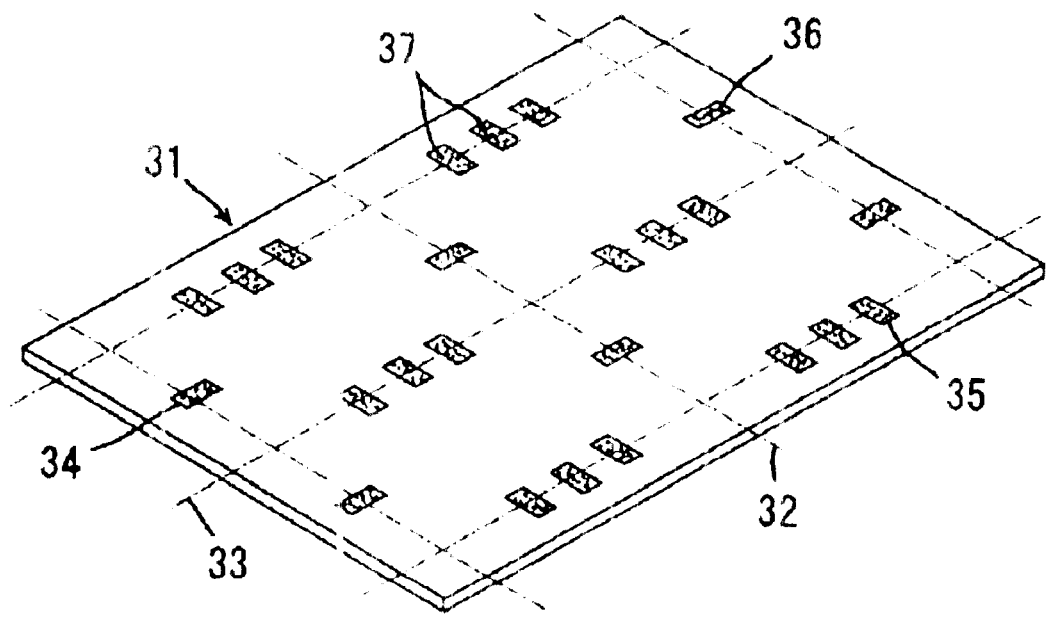
FIG. 3 is a perspective view showing the state in which terminal via hole conductors are formed in the ceramic green sheet shown in FIG. 2.

Next, as shown in FIG. 3, the individual throughholes 34 and 35 are filled with a conductive paste, and hence terminal via hole conductors 36 and 37 are arranged so as to penetrate the ceramic green sheet 31 in the thickness direction. The terminal via hole conductors 36 and 37 are formed of conductors filled in the throughholes 34 and 35. However, the terminal via hole conductors 36 and 37 may be formed of conductors applied onto the internal surfaces of the throughholes 34 and 35.

Although not shown in FIG. 3, in addition to the terminal via hole conductors 36 and 37, necessary wiring conductors are also formed on the ceramic green sheet 31. As the wiring conductors, for example, conductive films and via hole conductors other than the terminal via hole conductors 36 and 37 may be used.

The conductive films defining the wiring conductors are formed on the ceramic green sheet 31 by performing screen printing with a conductive paste. Depending on the position of the ceramic green sheet 31 when being laminated, the conductive films may be used as an internal conductive film or an external conductive film. The conductive film 20 shown in FIG. 7 is one of the conductive films formed in the step described above. In addition, the formation of conductive films may be performed at the same time that the step of filling the conductive paste in the throughholes 34 and 35 is performed for forming the terminal via hole conductors 36 and 37.

In addition, the via hole conductors defining the wiring conductor are formed by a step that is substantially the same as that of forming the terminal via hole conductors 36 and 37. The formation of throughholes for the via hole conductors as the wiring conductor is performed at the same time that the step of forming the throughholes 34 and 35 is performed, and the filling of a conductive paste in these throughholes may be performed at the same time that the step of filling the conductive paste in the throughholes 34 and 35 shown in FIG. 3 is performed.

Figure 4:
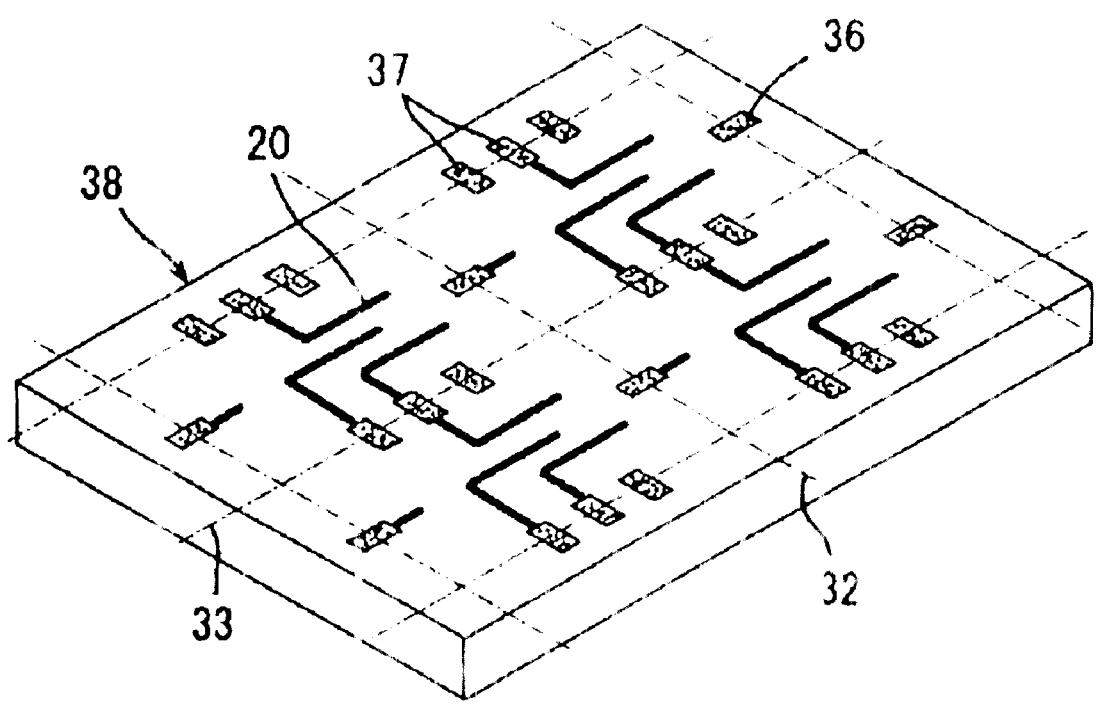
FIG. 4 is a perspective view showing a green mother electronic component formed by laminating a plurality of ceramic green sheets including the ceramic green sheet shown in FIG. 3.

Next, a plurality of ceramic green sheets including the ceramic green sheet 31 shown in FIG. 3 are laminated to each other and are then pressed in the lamination direction. As a result, a green mother electronic component 38 shown in FIG. 4 is obtained.

In this green mother electronic component 38, the above-described terminal via hole conductors 36 and 37 provided in the plurality of ceramic green sheets are connected to each other so as to penetrate the green mother electronic component 38 in the thickness direction thereof. However, the terminal via hole conductors 36 and 37 may not penetrate the green mother electronic component 38 in the thickness direction, and may extend through only a portion of the green mother electronic component 38 in the thickness direction.

In addition, the terminal via hole conductors 36 provided on the dividing lines 32 are electrically connected to conductive films formed inside the green mother electronic component 38.

Figure 5:
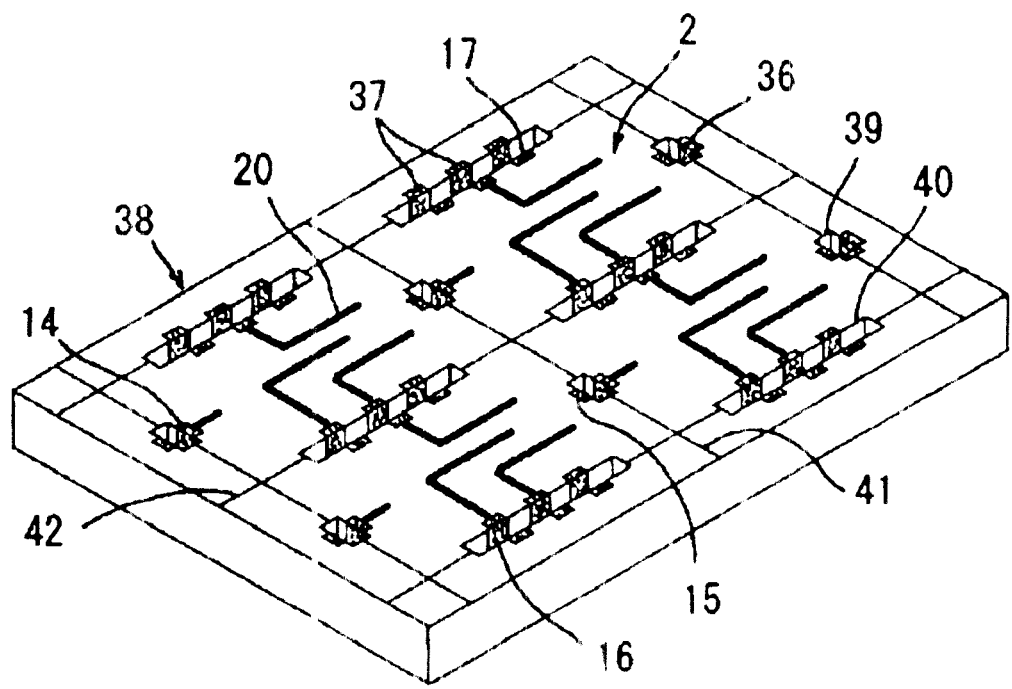
FIG. 5 is a perspective view showing the mother electronic component shown in FIG. 4, which is provided with penetrating holes.

As shown in FIG. 5, at the positions at which the terminal via hole conductors 36 and 37 of the green mother electronic component 38 are divided, the penetrating holes 39 and 40 are formed, respectively. These penetrating holes 39 and 40 are formed so as to penetrate the green mother electronic component 38.

Via the penetrating holes 39, the terminal via hole conductors 36 are divided, and part of each of the terminal via hole conductors 36 is exposed at the internal surface of the penetrating hole 39. Individual parts of the terminal via hole conductors 36 define the ground terminal electrodes 14 and 15 described above.

In addition, the penetrating holes 40 each have a relatively long shape in plan view. With the penetrating hole 40, a plurality of the terminal via hole conductors 37, i.e., in this preferred embodiment shown in the figures, three terminal via hole conductors 37 are divided, and three parts of the respective three terminal via hole conductors 37 are exposed at the internal surface of one penetrating hole 40. The individual parts of the terminal via hole conductors 37 are used as the terminal electrodes 16 and 17 described above.

As also shown in FIG. 5, on one major surface or the two major surfaces of the green mother electronic component 38, grooves 41 and 42 having, for example, a substantially V-shaped cross-section are formed. These grooves 41 and 42 are formed along the dividing lines 32 and 33 and each extends to locations at which the penetrating holes 39 and 40 are provided, respectively. The grooves 41 and 42 have a depth, for example, of from one about third to about one sixth of the thickness of the green mother electronic component 38.

Subsequently, the green mother electronic component 38 is fired.

Plating is then performed. More particularly, on the surfaces of the terminal electrodes 14 to 17 formed by dividing the terminal via hole conductors 36 and 37, plating films composed of, for example, Ni/Au or Ni/Sn are formed by wet plating. In this plating step, plating is performed on the surfaces of the conductive films 20 formed on the external surface of the green mother electronic component 38.

When the steps described above are complete, in each of the regions defined by the grooves 40 and 42 (dividing lines 32 and 33) of the fired mother electronic component 38, the laminated ceramic body 2 forming the desired multilayer ceramic electronic component 1 is formed. That is, the terminal electrodes 14 to 17 extend in the direction in which a plurality of the ceramic layers is laminated to each other and are formed by the division of the via holes filled with the conductive material, and each has a predetermined thickness in the direction from the side surfaces 6 to 9 toward the inside of the laminated ceramic body 2. Accordingly, the terminal electrodes have outstanding electrical conductivity and are electrically connected to respective internal electrode disposed inside the electronic component with minimal connection defects.

Figure 6:
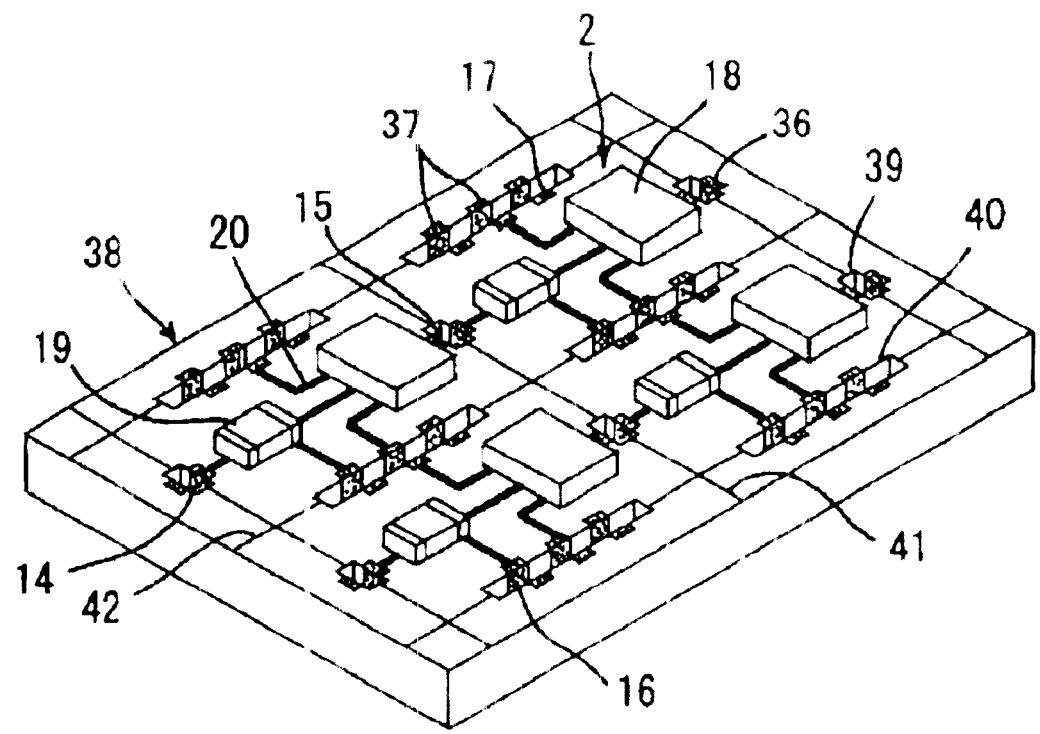
FIG. 6 is a perspective view showing the state in which elements are mounted on one major surface of the mother electronic component shown in FIG. 5.

Next, as shown in FIG. 6, on the first major surface 4 of each of the electronic component bodies 2 of the mother electronic component, the elements 18 and 19 described with reference to FIG. 7 are mounted.

Next, the mother electronic component 38 is divided using the grooves 41 and 42 in a so-called chocolate-break manner, and hence a plurality of the electronic component bodies 2 are obtained. When the mother electronic component 38 is divided, instead of the division performed in the chocolate-break manner, a laser or a dicer may be used. When the latter is used, the grooves 41 and 42 are not necessarily provided in the mother electronic component 38.

Next, as shown in FIG. 8, the cover 3 is prepared. Subsequently, the opening of the cover 3 is arranged to face the laminated ceramic body 2 side so as to cover the elements 18 and 19. In the state described above, as shown in FIG. 1, the foot portions 21 and 22 of the cover 3 are disposed in the first and the third notches 10 and 12 and are then bonded to the ground terminal electrodes 14 and 15, respectively, via solder or a conductive adhesive.

As described above, the cover 3 is attached to the laminated ceramic body 2, and as a result, the multilayer ceramic electronic component 1 as shown in FIG. 1 is complete.

Hereinafter, other preferred embodiments of the present invention will be described. In the description of the other preferred embodiments, the same reference numerals of the elements used for description of the above described preferred embodiment are used for the respective elements, and descriptions thereof are omitted.

Figure 9:
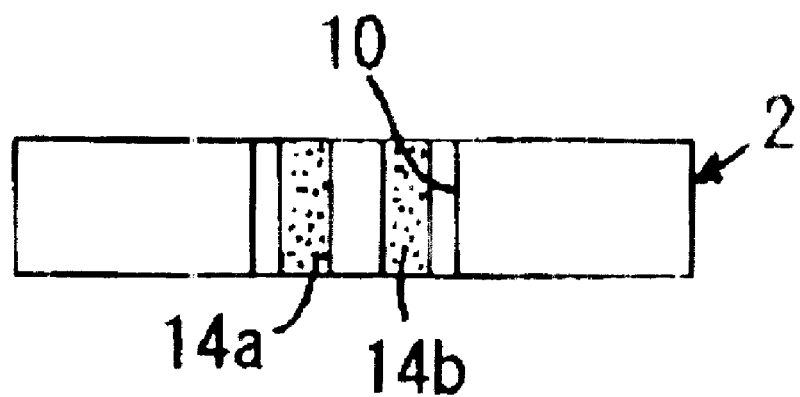
FIG. 9 is a perspective view showing a first side surface of a laminated ceramic body according to a second preferred embodiment of the present invention.

FIG. 9 illustrates a second preferred embodiment of the present invention and shows the first side surface 6 of the laminated ceramic body 2.

In the first notch 10 provided in the first side surface 6, a plurality of terminal electrodes, for example, two terminal electrodes 14a and 14b, are arranged in parallel. This arrangement improves the ground side. In addition, although not shown in the figure, instead of the terminal electrode 15 formed in the third notch 12 provided in the third side surface 8 of the laminated ceramic body 2, a plurality of terminal electrodes may be formed in a manner similar to that described above.

Figure 10:
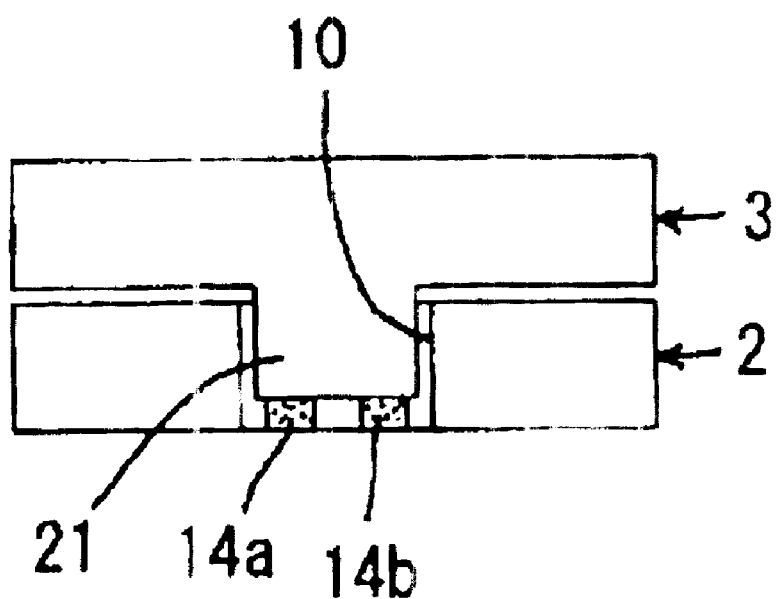
FIG. 10 is a side view showing the state in which the laminated ceramic body shown in FIG. 9 is provided with a cover.
Figure 11:
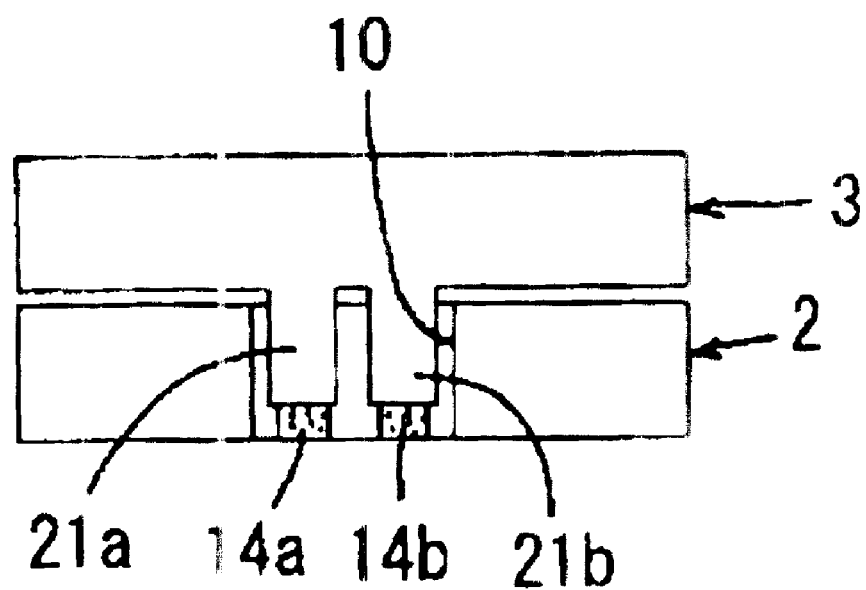
FIG. 11 is a side view showing a modified preferred embodiment in the state in which the laminated ceramic body shown in FIG. 9 is provided with a cover.

FIGS. 10 and 11 show two examples illustrating a method of fitting the cover 3 used in the second preferred embodiment shown in FIG. 9 to the laminated ceramic body 2.

In FIG. 10, one foot portion 21 provided on the cover 3 is bonded to the two terminal electrodes 14a and 14b.

In FIG. 11, the cover 3 is provided with two foot portions 21a and 21b, which correspond to the foot portion 21, and these two foot portions 21a and 21b are bonded to the terminal electrodes 14a and 14b, respectively.

Figure 12:
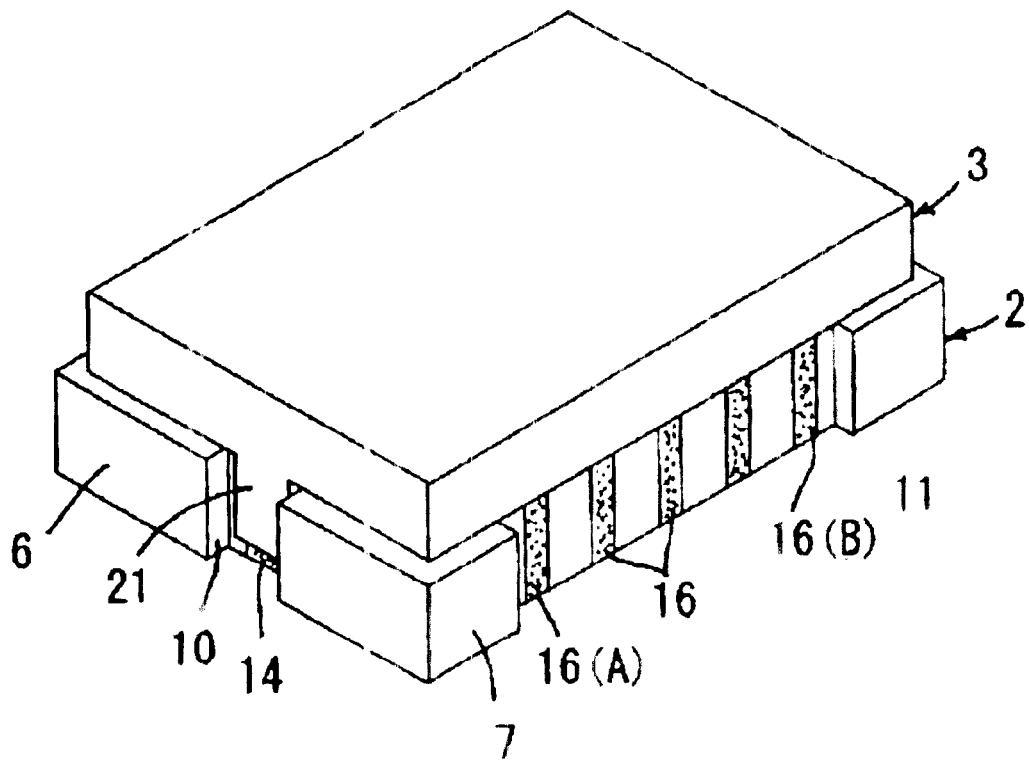
FIG. 12 is a perspective view showing the external appearance of a multilayer ceramic electronic component according to a third preferred embodiment of the present invention.

FIG. 12 illustrates a third preferred embodiment of the present invention. FIG. 12 corresponds to FIG. 1 described above. In FIG. 12, the same reference numerals of the elements shown in FIG. 1 designate the elements corresponding thereto, and descriptions thereof are omitted.

A multilayer ceramic electronic component 1a shown in FIG. 12 includes terminal electrodes 16 and 17 provided at the main surfaces of the respective second and fourth notches 11 and 13 provided on the second and the fourth side surfaces 7 and 9, respectively, of the laminated ceramic body 2. Although not shown in FIG. 12, the fourth side surface 9, the fourth notch 13, and the terminal electrode 17 are substantially the same as the second side surface 7, the second notch 11, and the terminal electrode 16, respectively. Hence, hereinafter, the second side surface 7, the second notch 11, and the terminal electrode 16 of the laminated ceramic body 2 will be described.

In the multilayer ceramic electronic component 1a shown in FIG. 12, among a plurality of the terminal electrodes 16 provided in the second notch 11 of the laminated ceramic body 2, for example, terminal electrodes 16(A) and 16(B) are each used as a ground terminal electrode. The other terminal electrodes 16 are arranged to define input/output terminals.

In this preferred embodiment, the ground terminal electrodes 16(A) and 16(B) are provide which are electrically connected to the ground terminal electrodes 14 and 15 but are not connected to the cover 3.

In addition, in the preferred embodiments shown in the figures, the ground terminal electrodes 14 and 15 are provided on the short side surfaces 6 and 8, respectively, of the laminated ceramic body 2, the plurality of the terminal electrodes 16 are arranged in parallel on the long side surface 7, and the plurality of the terminal electrodes 17 are arranged in parallel on the long side surface 9. However, in addition to those described above, for example, ground terminal electrodes may be provided on the long side surfaces 7 and 9 of the laminated ceramic body 2, and a plurality of terminal electrodes may be arranged in parallel on each of the short side surfaces 6 and 8. That is, the width of each of the first and the third side surfaces 6 and 8 may be larger or smaller than that of each of the second and fourth side surfaces 7 and 9 or may be equal thereto.

In the preferred embodiments shown in the figures, although the notches 10 to 13 are arranged so as to extend from the first major surface 4 of the laminated ceramic body 2 to the second major surface 5, the notches 10 to 13 may only extend from one of the major surfaces 4 and 5 to a desired position spaced from the other major surface. For example, the notches 10 and 12 in which the foot portions 21 and 22 of the cover 3 are disposed, respectively, may be arranged so as to only extend from the first major surface 4 to a desired position spaced from the second major surface 5. On the other hand, the notches 11 and 13 in which the terminal electrodes 16 and the terminal electrodes 17 are formed, respectively, may be arranged so as to only extend from the second major surface 5 to a desired position spaced from the first major surface 4.

Figure 13:
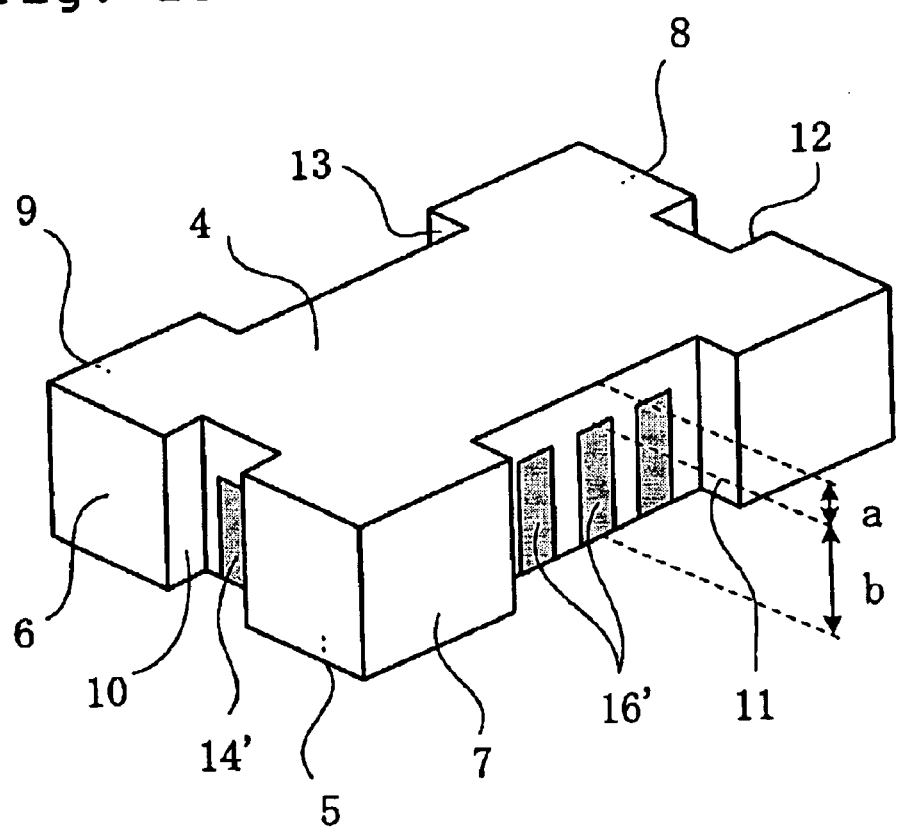
FIG. 13 is a perspective view showing the external appearance of a laminated ceramic body according to a fourth preferred embodiment of the present invention.

In addition, each of the terminal electrodes provided at the main surface of the corresponding notch may be arranged such that one end portion extends to the second major surface 4, and that the other end does not extend to the first major surface 4 and is a desired distance therefrom. For example, as shown in FIG. 13, according to a fourth preferred embodiment of the present invention, terminal electrodes 14' and 16' provided in the first and the second notches 10 and 11, respectively, are each provided such that one end (bottom side in the figure) extends to the second major surface 5, and the other end (top side in the figure) does not extend to the first major surface 4 and is spaced a desired distance therefrom. In addition, although not shown in the figure, each of the terminal electrodes provided in the third and the fourth notches preferably has the same structure as described above. That is, in the preferred embodiment shown in FIG. 13, when the thickness of the ceramic layer in the lamination direction is represented by a+b, the distance between the first major surface 4 and the other end of the terminal electrode 16' and the height thereof (distance between the two ends of the terminal electrode 16') are a and b, respectively. In this case, a/(a+b) is preferably in the range of from about 0.01 to about 0.5.

According to the multilayer ceramic electronic component of this preferred embodiment, since the front edge of the terminal electrode at the other end side is not exposed on the first major surface, compared to the multilayer ceramic electronic component of the first preferred embodiment, the mounting area of the first major surface 4 is increased, and hence a larger number of elements or larger elements may be mounted thereon, or a larger number of complicated surface conductive patterns may be formed thereon.

Figure 14:
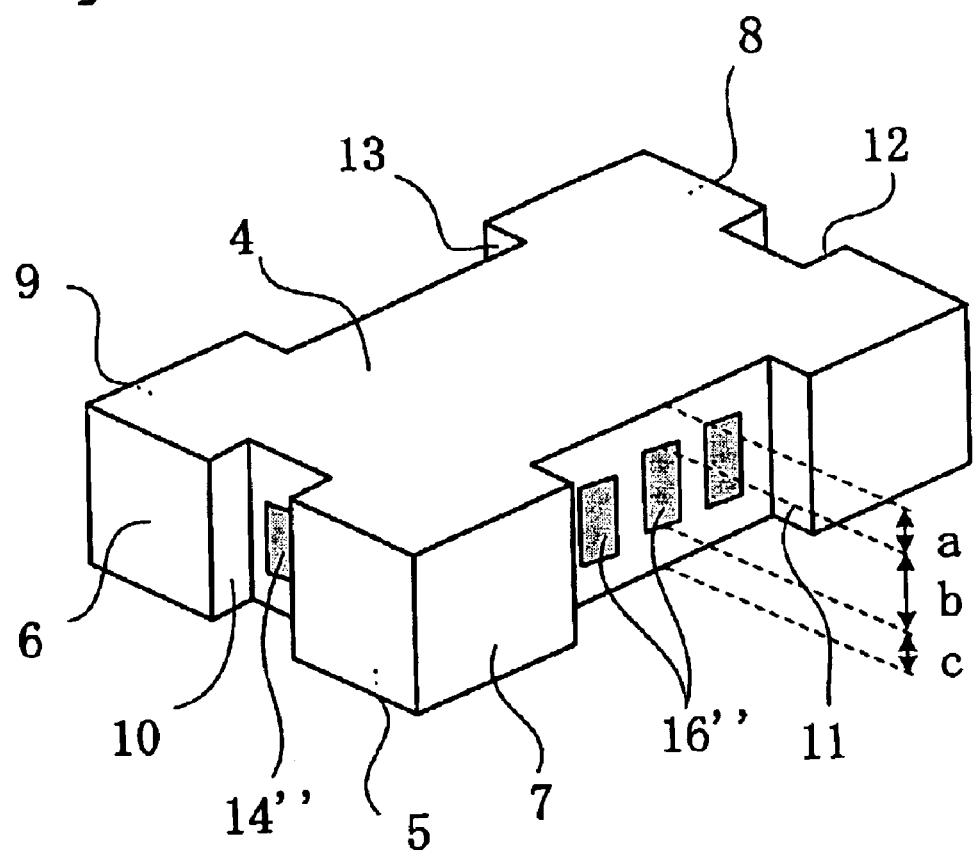
FIG. 14 is a perspective view showing the external appearance of a laminated ceramic body according to a fifth preferred embodiment of the present invention.

Each of the terminal electrodes provided at the main surfaces of the notches may be formed such that one end portion does not extend to the second major surface and is spaced a desired distance therefrom. In addition, the other end portion does not extend to the first major surface and is spaced a desired distance therefrom. For example, as shown in FIG. 14, according to a fifth preferred embodiment of the present invention, each of terminal electrodes 14" and 16" provided in the first and the second notches 10 and 11, respectively, is formed such that one end portion (bottom side in the figure) does not extend to the second major surface 5 and is spaced a desired distance therefrom, and the other end (top side in the figure) does not extend to the first major surface 4 and is spaced a desired distance therefrom. In addition, although not shown in the figure, each of the terminal electrodes provided in the third and the fourth notches has the same structure as described above. That is, in the preferred embodiment shown in FIG. 14, when the thickness of the ceramic layer in the lamination direction is represented by a+b+c, the distance between the first major surface 4 and the other end of the terminal electrode 16", the height thereof (distance between the two ends of the terminal electrode 16"), and the distance between said one end of the terminal electrode 16" and the second major surface 5 are a b, and c, respectively. In this case, a/(a+b+c) is preferably in the range of from about 0.01 to about 0.5, and more preferably, about 0.01 to about 0.3.

According to the multilayer ceramic electronic component of this preferred embodiment, as in the multilayer ceramic electronic component of the fourth preferred embodiment, since the front edge of the terminal electrode at the other end side is not exposed on the first major surface, compared to the multilayer ceramic electronic component of the first preferred embodiment, the mounting area of the first major surface 4 is increased, and hence a larger number of elements or larger elements may be mounted thereon, or a larger number of complicated surface conductive patterns may be formed thereon. Furthermore, since the one end of the terminal electrode is not exposed on the second major surface, when this multilayer ceramic electronic component is mounted on a mother board, such as a printed circuit board, connection (for example, solder connection) between surface electrodes of the mother board and the terminal electrodes of the multilayer ceramic electronic component are performed at the side surfaces thereof, and hence visual external inspection for connection defects is easily performed.

As has been described, in the multilayer ceramic electronic component according to preferred embodiments of the present invention, since the terminal electrodes to which the foot portions of the cover are bonded are placed in the notches provided in the laminated ceramic body, the positioning of the cover to the laminated ceramic body is easily performed. In addition, with the bonding described above, the solder or conductive paste is prevented from being applied to undesired portions even when another soldering is performed, or the solder remelts. Accordingly, for example, short-circuiting between terminal electrodes is efficiently prevented.

In addition, since a plurality of the terminal electrodes is arranged in parallel in one notch, the alignment pitch of the terminal electrodes is decreased without causing any problem.

In particular, when the notches are arranged in the side surfaces of the laminated ceramic body so as to extend from the first major surface to the second major surface, and the terminal electrodes are obtained by dividing the via hole conductors, a multilayer ceramic electronic component is manufactured by advantageously using the method of preferred embodiments of the present invention for manufacturing a multilayer ceramic electronic component.

In addition, when the method for manufacturing a multilayer ceramic electronic component, according to preferred embodiments of the present invention, is used, since it is not necessary to decrease the diameter of the penetrating hole, which is formed into a notch in which a plurality of terminal electrodes is formed in parallel, a fluent flow of a wet plating solution is be disturbed when plating is performed for the terminal electrode, and as a result, proper formation of a plating film is easily performed.

Since it is not necessary to decrease the intervals of the penetrating holes described above, the problem of breakage in a step of providing the penetrating hole or a firing step is prevented.

Since the method of preferred embodiments of the present invention is different from that in which a penetrating hole is provided for each of a plurality of terminal electrodes formed in parallel, even when the alignment pitch of the terminal electrodes is decreased, sawtooth projections are not formed between the notches obtained by dividing the penetrating holes, and hence the problem of chipping is prevented.

In addition, since the number of penetrating holes is not increased with the increase in the number of terminal electrodes, the number of step of forming the penetrating hole is decreased.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A multilayer ceramic electronic component comprising:
a laminated ceramic body including a plurality of ceramic layers laminated to each other, the laminated ceramic body having a first major surface and a second major surface facing each other, and first, second, third, and fourth side surfaces extending between the first and second major surfaces, the first and third side surfaces being arranged to face each other, the second and fourth side surfaces being arranged to face each other, first, second, third, and fourth notches provided in the first, second, third, and fourth side surfaces, respectively, the laminated ceramic body further including ground terminal electrodes provided at main surfaces of the first and third notches, and a plurality of terminal electrodes arranged substantially in parallel at a main surface of each of the second and fourth notches;
at least one element mounted on the first major surface; and
a cover disposed such that an opening thereof faces the laminated ceramic body to cover said at least one element, the cover having foot portions disposed in the first and third notches, the foot portions being bonded to the ground terminal electrodes, whereby the cover is attached to the laminated ceramic body.

2. The multilayer ceramic electronic component according to claim 1, wherein the cover is made of metal, and the foot portions and the ground terminal electrodes are bonded to each other via one of solder and a conductive adhesive.

3. The multilayer ceramic electronic component according to claim 1, wherein the terminal electrodes are defined by terminal via hole conductors.

4. The multilayer ceramic electronic component according to claim 3, wherein each of the first, second, third, and fourth notches extends from the first major surface to the second major surface.

5. The multilayer ceramic electronic component according to claim 4, wherein the terminal electrodes provided at the main surfaces of the first, second, third, and fourth notches are each arranged such that one end portion extends to the second major surface, and that the other end portion extends to the first major surface.

6. A multilayer ceramic electronic component according to claim 4, wherein the terminal electrodes provided at the main surfaces of the first, second, third, and fourth notches are each arranged such that one end portion extends to the second major surface, and the other end portion does not extend to the first major surface and is spaced a predetermined distance therefrom.

7. The multilayer ceramic electronic component according to claim 4, wherein the terminal electrodes provided at the main surfaces of the first, second, third, and fourth notches are each arranged so that one end portion does not reach the second major surface and is spaced a predetermined distance therefrom, and that the other end portion does not reach the first major surface and is spaced a predetermined distance therefrom.

8. The multilayer ceramic electronic component according to claim 1, wherein said cover is made of resin.

9. The multilayer ceramic electronic component according to claim 8, wherein said resin cover includes a conductive plating film provided on a surface thereof.

10. The multilayer ceramic electronic component according to claim 1, wherein at least one conductive film is provided on the first major surface of the laminated ceramic body, and said at least one element is mounted on said at least one conductive film.

11. A method for manufacturing multilayer ceramic electronic components, comprising the steps of:

forming a green mother electronic component including a plurality of ceramic green sheets laminated to each other, and terminal via hole conductors which define terminal electrodes;

forming penetrating holes, which penetrate the green mother electronic component, at positions at which the terminal via hole conductors are to be divided such that the terminal via hole conductors are exposed at the internal surfaces of the penetrating holes;

firing the green mother electronic component;

dividing the mother electronic component along dividing lines passing through the penetrating holes to form electronic component bodies provided with the terminal electrodes formed by the division of the terminal via hole conductors, the terminal electrodes being provided at main surfaces of notches formed by the division of the penetrating holes;

mounting elements on first major surfaces of the electronic component bodies; and disposing covers such that openings thereof face the electronic component bodies to cover the elements; wherein the main surface of at least one of the notches includes a plurality of the terminal electrodes provided therein.

12. The method according to claim 11, wherein the step of forming a green mother electronic component includes the steps of:

preparing said plurality of ceramic green sheets;

providing throughholes in at least one of said plurality of ceramic green sheets for disposing the terminal via hole conductors;

forming the terminal via hole conductors in the throughholes;

forming wiring conductors on at least one of said plurality of ceramic green sheets, and laminating said plurality of ceramic green sheets to each other.

13. The method according to claim 11, wherein the step of dividing the mother electronic component along dividing lines is performed before the step of mounting elements on first major surfaces of the electronic component bodies is performed.

14. The method according to claim 11, wherein the step of disposing covers such that openings thereof face the electronic component bodies to cover the elements is performed after the step of dividing the mother electronic component along dividing lines is performed.

15. The method according to claim 11, wherein the covers are made of a metal.

16. The method according to claim 11, wherein the terminal electrodes provided at the main surfaces of the first, second, third, and fourth notches are each arranged such that one end portion extends to the second major surface, and that the other end portion extends to the first major surface.

17. The method according to claim 11, wherein the terminal electrodes provided at the main surfaces of the first, second, third, and fourth notches are each arranged such that one end portion extends to the second major surface, and the other end portion does not extend to the first major surface and is spaced a predetermined distance therefrom.

18. The method according to claim 11, wherein the terminal electrodes provided at the main surfaces of the first, second, third, and fourth notches are each arranged so that one end portion does not reach the second major surface and has a predetermined distance therefrom, and that the other end portion does not reach the first major surface and has a predetermined distance therefrom.

19. The method according to claim 11, wherein said covers are made of resin.

20. The method according to claim 19, wherein said resin covers include a conductive plating film provided on a surface thereof.

* * * * *